US 6,586,733 B1

United States Patent
Veneklasen et al.

(10) Patent No.: US 6,586,733 B1
(45) Date of Patent: Jul. 1, 2003

(54) APPARATUS AND METHODS FOR SECONDARY ELECTRON EMISSION MICROSCOPE WITH DUAL BEAM

(75) Inventors: Lee Veneklasen, Castro Valley, CA (US); David L. Adler, San Jose, CA (US)

(73) Assignee: KLA-Tencor, San Jose, CA (US)

(*) Notice: Subject to any disclaimer, the term of this patent is extended or adjusted under 35 U.S.C. 154(b) by 0 days.

(21) Appl. No.: 09/579,867

(22) Filed: May 25, 2000

Related U.S. Application Data

(60) Provisional application No. 60/135,742, filed on May 25, 1999, and provisional application No. 60/204,248, filed on May 15, 2000.

(51) Int. Cl.[7] .............................................. G01N 23/225
(52) U.S. Cl. ..................... 250/306; 250/307; 250/310
(58) Field of Search ............................... 250/306–314, 250/397, 399, 492.1–492.3

(56) References Cited

U.S. PATENT DOCUMENTS

| | | | |
|---|---|---|---|
| 4,472,631 A | | 9/1984 | Enke et al. ................. 250/281 |
| 4,686,566 A | | 8/1987 | Bucher ....................... 358/113 |
| 4,877,326 A | * | 10/1989 | Chadwick et al. .......... 356/394 |
| 5,144,149 A | | 9/1992 | Frosch ..................... 250/493.1 |
| 5,412,209 A | | 5/1995 | Otaka et al. ................ 250/310 |
| 5,493,116 A | | 2/1996 | Toro-Lira et al. .......... 250/310 |
| 5,552,602 A | * | 9/1996 | Kakibayashi et al. ....... 250/311 |
| 5,557,105 A | * | 9/1996 | Honjo et al. ............... 250/310 |
| 5,869,833 A | * | 2/1999 | Richardson et al. ........ 250/310 |
| 6,066,849 A | * | 5/2000 | Masnaghetti et al. ....... 250/310 |
| 6,087,659 A | | 7/2000 | Adler et al. ................ 250/310 |
| 6,091,249 A | | 7/2000 | Talbot et al. ............... 324/751 |
| 2002/0130260 A1 | * | 9/2002 | McCord et al. ............. 250/306 |

FOREIGN PATENT DOCUMENTS

| | | | |
|---|---|---|---|
| DE | 3621045 A | 1/1987 | |
| EP | 0 266 535 A | 5/1988 | |
| EP | 0417354 A | 3/1991 | |
| EP | 0594394 A | 4/1994 | |
| EP | 0810629 A1 | 12/1997 | ............ H01J/37/28 |
| EP | 0853243 A2 | 7/1998 | ......... G01R/31/305 |
| EP | 0892275 A2 | 1/1999 | ......... G01R/31/307 |

OTHER PUBLICATIONS

Veneklasen, Lee H., "The Continuing of Low–Energy Electron Microscopy for Characterizing Surfaces.", Dec. 1, 1992, Review Of Scientific Instruments, US, American Institute Of Physics. New York, vol. 63, No. 12, pp. 5513–5532.

Ludwig Reimer, "Scanning Electron Microscopy", Physics of Image Formation and Microanalysis, 3.5.2 Charging of Insulating Specimens, pp. 119–123 No date.

\* cited by examiner

*Primary Examiner*—John R. Lee
*Assistant Examiner*—Christopher M. Kalivoda
(74) *Attorney, Agent, or Firm*—Beyer, Weaver & Thomas, LLP.; Mary R. Olynick, Esq.

(57) ABSTRACT

Disclosed is an apparatus for inspecting a sample. The apparatus includes a first electron beam generator arranged to direct a first electron beam having a first range of energy levels toward a first area of the sample and a second electron beam generator arranged to direct a second electron beam having a second range of energy levels toward a second area of the sample. The second area of the sample at least partly overlaps with the first area, and the second range of energy levels are different from the first range such that charge build up caused by the first electron beam is controlled. The apparatus further includes a detector arranged to detect secondary electrons originating from the sample as a result of the first and second electron beam interacting with the sample

21 Claims, 7 Drawing Sheets

| | PHOTO-ELECTRON EMISSION MICROSCOPY PEM | LOW ENERGY EMISSION MICROSCOPY LEEM | LOW VOLTAGE SCANNING ELECTRON MICROSCOPY SEM | SECONDARY ELECTRON EMISSION MICROSCOPY SEEM |
|---|---|---|---|---|
| INCIDENT PARTICLES | PHOTONS $h\nu = E_p >$ BINDING ENERGY | ELECTRONS ($e_1$) $0 < E_p < 100eV$ | ELECTRONS | ELECTRONS |
| DETECTED PARTICLES | PHOTO-ELECTRONS ($e_2$) | REFLECTED ELECTRONS ($e_1$) | SECONDARY ELECTRONS ($e_2$) | SECONDARY ELECTRONS ($e_2$) |
| IMAGING METHOD | PARALLEL IMAGING | PARALLEL IMAGING | RASTER SCANNING | PARALLEL SCANNING |
| CHARGING | CHARGE BUILD-UP (+) POSITIVE | CHARGE BUILD-UP (-) NEGATIVE | LIMITED CHARGING | LIMITED CHARGING |

Figure 3

APPARATUS AND METHODS FOR SECONDARY ELECTRON EMISSION MICROSCOPE WITH DUAL BEAM

CROSS REFERENCE TO RELATED APPLICATIONS

This application claims priority of U.S. patent provisional application, having Application No. 60/135,742 filed May 25, 1999 by Veneklasen et al. and U.S. provisional application, having application Ser. No. 60/204,248 filed May 15, 2000 by Veneklasen et al., which applications are incorporated herein by reference in their entirety for all purposes. Additionally, this application is a continuation-in-part and claims priority of U.S. patent application, having application Ser. No. 09/354,948 filed Jul. 16, 1999 entitled "Apparatus and Method for Secondary Electron Emission Microscope" by Adler, et al., which has assignment rights in common and is incorporated herein by reference in its entirety for all purposes.

BACKGROUND OF THE INVENTION

The present invention relates generally to an apparatus and a method for using electron beams to microscopically inspect the surface of an object, and more particularly to inspect layers in a semiconductor device.

A variety of methods have been used to examine microscopic surface structures of semiconductors. These have important applications in the field of semiconductor chip fabrication, where microscopic defects at a surface layer make the difference between a functioning and a nonfunctioning chip. For example, holes or vias in an intermediate insulating layer often provide a physical conduit for an electrical connection between two outer conducting layers. If one of these holes or vias is inadequately etched or becomes clogged with foreign material, it will be impossible to establish this electrical connection and the whole chip may fail. Examination of the microscopic defects in the surface of the semiconductor layers is necessary to ensure proper functioning of the chips.

Electron beams have several advantages over other mechanisms to examine samples. Light beams have an inherent resolution limitation of about 100 nm–200 nm, but electron beams can investigate feature sizes as small as a few nanometers. Electron beams are manipulated fairly easily with electrostatic and electromagnetic elements, and are certainly easier to produce and manipulate than x-rays.

Electron beams in semiconductor defect inspection do not produce as many false positives (elements inaccurately identified as defective) as optical beams. Optical beams are sensitive to problems of color noise and grain structures whereas electron beams are not. Oxide trenches and poly-silicon lines are especially prone to false positives with optical beams due to grain structure.

A variety of approaches involving electron beams have been utilized for examining surface structure. In low-voltage scanning electron microscopy (SEM), a narrow beam of primary electrons is raster-scanned across the surface to emit secondary electrons. If the primary electrons in the beam of scanning electron microscopy are near a particular known electron energy (called E2), there is a minimal corresponding charge build-up problem associated with SEM, and the surface of the sample remains relatively neutral. However, raster scanning a surface with scanning electron microscopy is slow because each pixel on the surface is collected sequentially. Moreover, a complex and expensive electron beam steering system is needed to control the beam pattern.

Another approach is called Photo-Electron Emission Microscopy (PEM or PEEM), in the which photons are directed at the surface of the sample to be studied, and by the photoelectric effect, electrons are emitted from the surface. On an insulating surface, the emission of these electrons, however, produces a net positive charge on the sample surface since there is a net flux of electrons from the surface. The sample continues to charge positively until there are no more emitted electrons, or electrical breakdown occurs. This charge build-up is especially problematic when imaging insulator materials.

Another method of examining surfaces with electron beams is know as Low Energy Electron Microscopy (LEEM), in which a relatively wide beam of low-energy electrons is directed to be incident upon the surface of the sample, and electrons reflected from the sample are detected. However, LEEM suffers from a similar charge build-up problem since electrons are directed at the sample surface, but not all of the electrons are energetic enough to leave the surface, which repels further electrons from striking the sample, resulting in distortions and shadowing of the surface.

Several prior art publications have discussed a variety of approaches using electron beams in microscopy, but none have determined how to do so with parallel imaging, while at the same time reducing or eliminating the charge build-up problem. One of these approaches is described by Lee H. Veneklasen in "The Continuing Development of Low-Energy Electron Microscopy for Characterizing Surfaces," *Review of Scientific Instruments*, 63(12), December 1992, Pages 5513 to 5532. Vaneklasen notes generally that the LEEM electron potential difference between the source and sample can be adjusted between zero and a few keV, but he does not recognize the charging problem or propose a solution to it.

Thus, there remains a need for methods and apparatus that utilize electron beams to investigate sample surfaces, while minimizing charge build-up problems and increasing the speed of examining sample surfaces.

SUMMARY OF THE INVENTION

Accordingly, the present invention addresses the above problems by providing apparatus and methods for parallel imaging. In general terms, a first beam is used to generate an image of a relatively wide area of a sample. Parallel imaging is accomplished by using a relatively wide beam. A second beam having a lower landing energy than the first beam may be used in order to reduce positive charge build up on the sample that may result from the first beam.

In one embodiment, an apparatus for inspecting a sample is disclosed. The apparatus includes at least a first electron beam generator arranged to direct a first electron beam having a first range of energy levels toward a first area of the sample and a second electron beam generator arranged to direct a second electron beam having a second range of energy levels toward a second area of the sample. The second area of the sample at least partly overlaps with the first area, and the second range of energy levels are different from the first range such that charge build up caused by the first electron beam is controlled. The apparatus further includes a detector arranged to detect secondary electrons originating from the sample as a result of the first and second electron beam interacting with the sample. In a preferred embodiment, the first electron beam has a width appropriate for parallel multi-pixel imaging, and the first and second electron beam generator are arranged to concurrently produce the first and second beams.

In another embodiment, a method for controlling charging of a surface while exposing the surface to a beam of charged particles is disclosed. The surface is exposed to a first set of electrons in a first beam with the first set of electrons having energies within a first range. The surface is exposed to a second set of electrons in a beam with the second set of electrons having energies within a second range, different from the first range, wherein the second range of energies is predetermined to provide electrons from the second set which land on the surface to reduce positive charge present on the surface. In a preferred embodiment, the surface is concurrently exposed to said first set of electrons and said second set of electrons.

The present invention has several advantages. For example, the apparatus and methods allow imaging of a large number of pixels in parallel on a detector array, and thereby has the properties of being faster and lower in noise than conventional Scanning Electron Microscopes and methods. Additionally, electron beam scanning systems are not required, and the electron beam current densities are not as high so that the probability of damaging sensitive samples is lessened.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 3 is a chart comparing the SEEM technique of the invention to prior art electron beam inspection techniques.

DETAILED DESCRIPTION OF SPECIFIC EMBODIMENTS

Reference will now be made in detail to the specific embodiments of the invention. Examples of the these specific embodiments are illustrated in the accompanying drawings. While the invention will be described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
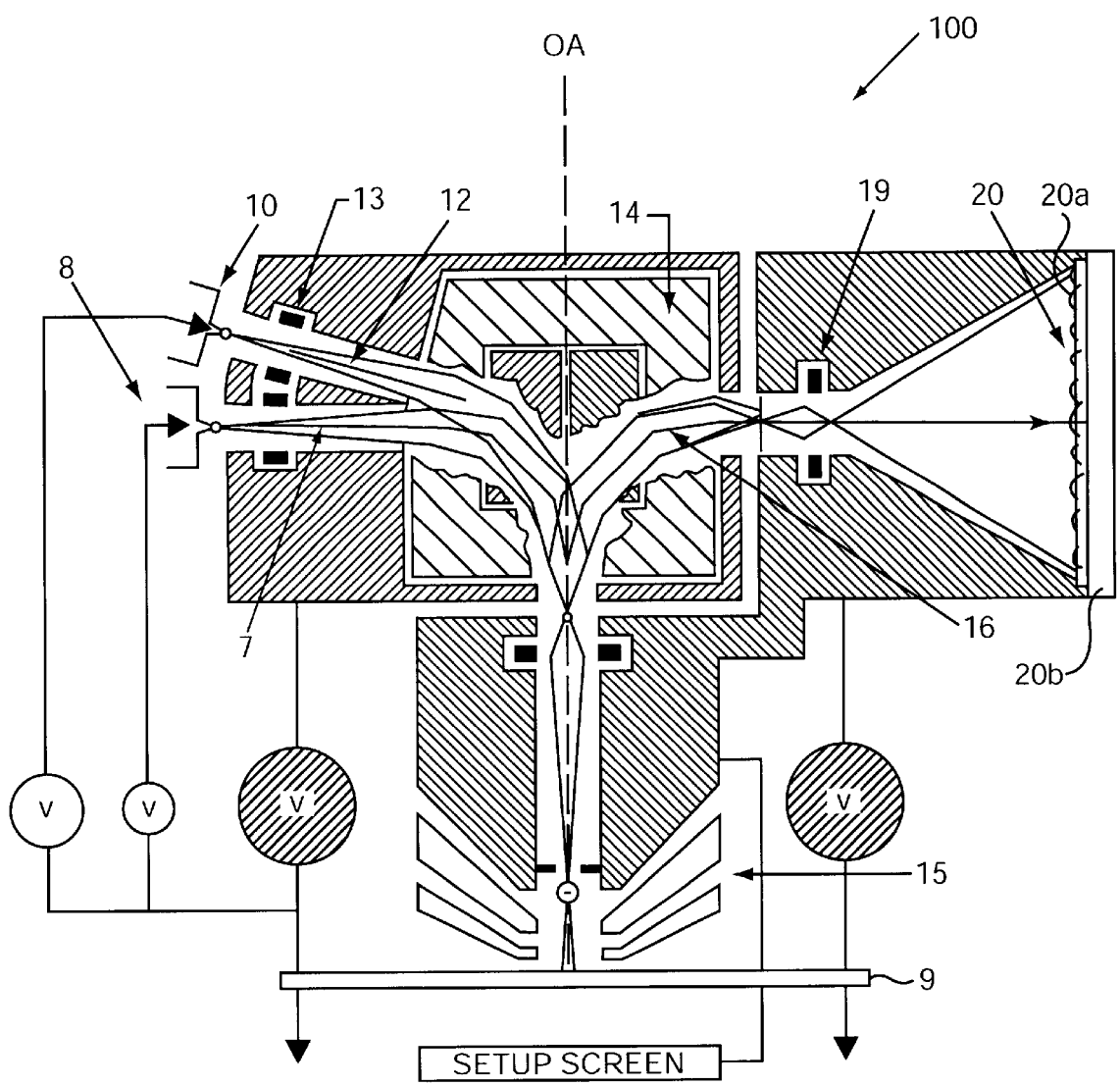
FIG. 1 shows the basic configuration for the Secondary Electron Emission Microscopy (SEEM) apparatus having dual beams in accordance with one embodiment of the present invention.

FIG. 1 shows the basic configuration for the Secondary Electron Emission Microscopy (SEEM) apparatus 100 having dual beams in accordance with one embodiment of the present invention. The SEEM 100 includes two electron gun sources 10 and 8 that each emits a beam of primary electrons $e_1$ along paths 12 and 7, respectively.

The electron beams are each collimated by electron lens 13 and continue along paths 12 and 7. Magnetic beam separator 14 then bends the collimated electron beams so that they are incident along electron optical axis OA normal to the surface of a sample 9 to be inspected. In other words, the two beams may be directed to strike a same general area of the sample at about the same time.

The landing energy of one of the beams is selected to balance charge on the surface of the sample. In one embodiment, one of the beams has a landing energy on the order of 1 keV. Although the landing energy of the first beam may be selected to result in a neutrally charged sample, in certain types of materials (e.g., insulators) the first beam results in a net positive charge build up on the surface of the sample. That is, electrons are lost from the sample due to a strong electric field that is produced at the surface by the higher energy beam. Thus, a second beam having a lower landing energy is used in conjunction with the first higher energy beam to reduce any positive charge build up on the sample resulting from the higher energy beam. The lower energy beam preferably has an energy of approximately zero eV.

In theory, the landing energy of the second beam is selected to lock the surface voltage of the sample into a predetermined voltage value. When a lower voltage beam is used, the surface of the sample seems to be electrically connected by a wire to an electrode (i.e., the source of the electrons of the second lower beam). This voltage locking mechanism provides a way to automatically lock in the surface such that the surface does not charge even for a relatively broad range of substrate materials.

In one embodiment, the lower energy beam has a landing energy of about 0 eV, which value facilitates reduction of positive charge build up resulting from the higher energy beam. In theory, the electrons within the lower energy are insufficiently energetic to cause the emission of secondary or backscattered electrons. These lower energy electrons compensate for any surface charging that might otherwise have been produced by the higher energy beam. The lower energy electrons will land on the surface if the surface becomes positively charged, and will eliminate this positive charge. If the surface is not sufficiently positively charged, these electrons will not land.

Objective electron lens 15 focuses the primary electrons, $e_1$ into two overlapping beams. Preferably, the lower energy beam has a same or larger spot size than the higher energy beam. That is, the lower energy beam falls on a spot that is equal to or encompasses the spot of the higher energy beam. Thus, the lower energy ad beam may facilitate reducing the positive charge build up that is present within the entire spot area of the higher energy beam. A larger spot size for the lower energy beam may be required to compensate for misalignments within the beam focusing system.

The size of the electron beam spots on the sample 9 from the two beams are preferably in the range of 0.1 to 100 millimeters, and more preferably are about one to two millimeters. The size of this beam at the sample and imaging planes is optionally variable with a zoom imaging system to control the resolution and rate of acquiring the image. In any event, if it is desired to eliminate edge effects, the beam widths should be larger than, and preferably at least twice the characteristic dimension of, the detector at the image plane.

Primary electrons $e_1$ incident on the sample 9 produce electrons e, (which could be secondary, backscattered or mirrored) which travel back along the axis OA perpendicular to the inspection surface to objective electron lens 15, where they are recollimated. Magnetic beam separator 14 bends the electrons e2 to travel along image path 16. The electron beam along image path 16 is focused by projection electron lens 19 onto an imaging plane of detector 20.

The detector 20 may be in any suitable form for detecting the secondary electrons. For example, the detector 20 may include an electron imager (e.g., as shown, a YAG screen 20a) for converting the electron beam into a light beam. The light beam may then be detected by a camera or preferably a time delay integrating (TDI) optical or electron detector 20b. The operation of a TDI optical detector is disclosed in U.S. Pat. No. 4,877,326 to Chadwick et al, which is incorporated herein by reference. Alternatively, the image information may be processed directly from a 'back thinned' TDI electron detector without using an electron imager or YAG screen. Signals collected from the TDI detector can be processed and compared with other data to inspect the substrate and to identify and/or classify possible defects and other features thereon. Such processing and comparison could be performed in a die to die mode, in which nominally identical portions of selected semiconductor die are compared to one another, and differences therein may represent defects. Such processing and comparison could instead or additionally be performed in an array mode, in which nominally identical portions of a repeating array present on a single semiconductor die are compared to one another, and differences may again represent defects. Or such processing and comparison could be performed in a die to database mode, in which data (e.g., images) from the inspected portion of the substrate is compared to corresponding data derived from a reference database. The reference database may be derived from or identical to the database used to create the images present on the inspected portion of the substrate. Alternatively, the reference database could be derived from other rules corresponding to the expected images of the structures, such as arrays or other repeating structures or test structures which may have a partially repeating or predictably changing design.

Figure 2:
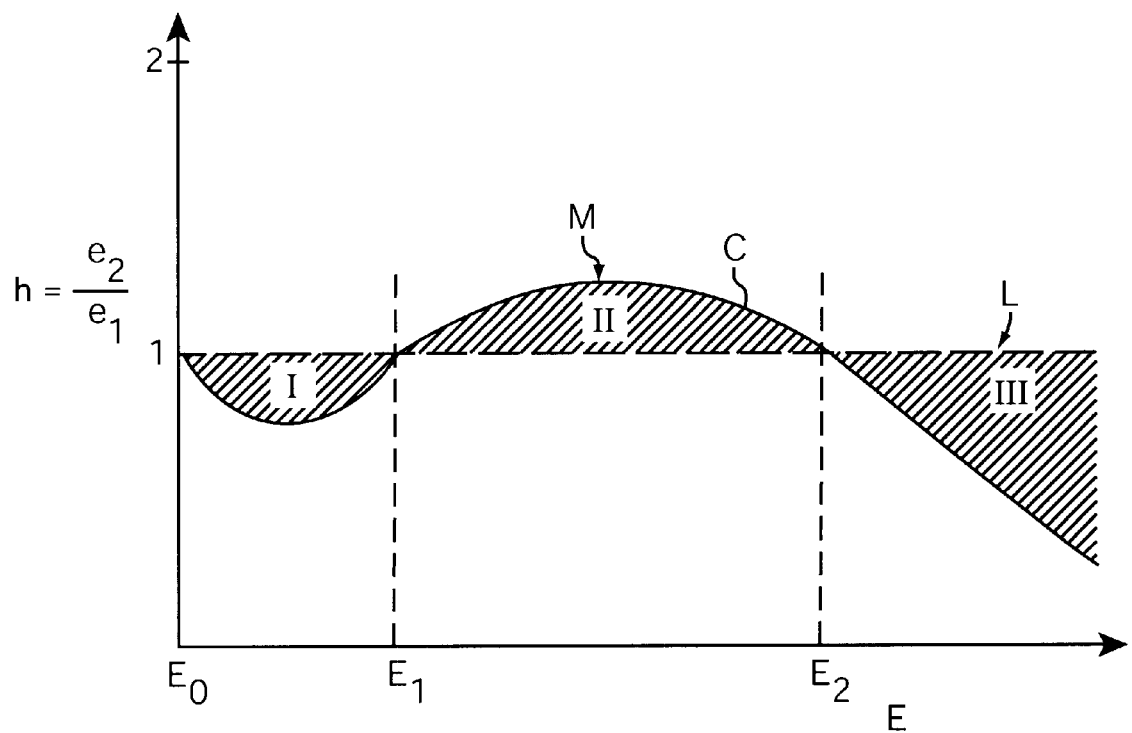
FIG. 2 is a graph of the relationship between the charge balance yield ratio and the primary electron energy in a system having a single beam.

FIG. 2 is a graph showing the charge ratio versus primary electron energy characteristic of single incident electron beam inspection techniques such as LEEM, SEM and SEEM. Yield ratio $\eta$ is defined as the number of electrons emitted by the surface, $e_2$, divided by the number of electrons incident on the surface, $e_1$. Yield ratio $\eta$ thus defines the amount of charge build-up on the surface being inspected since there will be a net charge build-up wherever $\eta$ does not equal unity. A yield ratio of greater than one implies that more electrons are being emitted than are incident, resulting in a net positive charge at the surface, and conversely a yield ratio of less than one indicates that more electrons are incident on the surface than are being emitted, resulting in a negative charge build-up.

Yield curve C indicates the experimentally-derived mathematical function that defines the yield ratio at various incident election energies, E, for a typical sample substance. As shown FIG. 2, line L is the line of charge balance, $\eta=1$, and there are only three points on yield curve C where charge balance is achieved, i.e. $e_2/e_1=1$. These three points are $E_0=0$, $E_1$, and $E_2$. (Energy $E_0=0$ is uninteresting for present purposes since it represents a situation where no electrons are incident on the sample.). In the region I between line L and yield curve C, there is an excess of negative charge since $e_2$ is greater than $e_1$. In region II, between line L and yield curve C, there is an excess of positive charge since e1 is greater than $e_2$, i.e. more secondary electrons are emitted than primary electrons are incident. In region III, between line L and curve C, the charge build-up again becomes negative.

One can see from FIG. 2 that on yield curve C there are only two significant points, $E_1$ and $E_2$, where there is likely to exist a charge balance. The problem is that only point $E_2$ is actually stable. That is, if the energy, E, of the primary electrons incident on the sample surface varies in either direction from $E_1$ by small amount, say $\Delta E_1$, the charge balance is quickly lost. Charge balance $\eta$ becomes increasingly negative or increasingly positive depending upon whether $E_1$ was approached from the $+\Delta E_2$ or $-\Delta E_2$ tends to return the beam energy to point $E_2$. The value to of $E_1$ or $E_2$ have been experimentally determined from a variety of substances, such s silicon dioxide, aluminum, and polysilicon. While each substance has its own characteristic yield curve C, the general shape of these yield curves is as shown.

FIG. 2 illustrates graphically the problem with past techniques of electron beam inspection, and shows why the SEEM technique described in the parent application provides unexpected advantages. Low Energy Electron Microscopy (LEEM) generally operated below $E_1$, with electron energies of 100 eV or less. Since point $E_1$ is unstable, LEEM suffered from the problem of charge build-up. Scanning Electron Microscopy (SEM) operated just below $E_2$ is stable, there was no problem with charge build-up in SEM, but SEM is slow precisely because it requires scanning. Prior to the present invention, it is believed that none had thought to drive the relatively wide beam of the LEEM parallel imaging system at a relatively high energy (e.g., $E_2$), as is recognized by the SEEM technique of the invention. The SEEM technique of the present invention is therefore the first recognition of the advantages of combining the parallel imaging of LEEM with the charge balance of SEM.

Although in theory, one may operate a relatively wide beam at $E_2$, it may be difficult to maintain the wide beam at a stable landing energy (e.g., $E_2$) without charge build-up occurring on the sample. Since the $E_2$ value depends on material composition, the $E_2$ value will necessarily vary as the beam moves across the sample and over various structures having different material compositions. Thus, even though the SEEM apparatus may be initially configured to operate at $E_2$ for an initial beam position on a first material of the sample, the landing energy will move away from $E_2$ as the beam moves across a different material on the sample. Accordingly, the present invention provides a second beam at a lower landing energy to compensate for any charge build up that may occur.

Advantageously, the first beam does not even have to operate at $E_2$ in order to minimize charge build up since the second beam compensates for positive charge build up. Preferably, the high-energy beam operates between $E_1$ and $E_2$ and more preferably operates at the yield peak between $E_1$ and $E_2$. A local charge equilibrium may be automatically established by the appropriate selection of energy and flux of the beams such that the potential of the surface is locked within a selected range. The high-energy beam energy may be selected to have a positive-charging effect on the sample surface (e.g., yield is greater than 1). Thus, the high-energy beam causes more secondary and backscattered electrons to be ejected from the surface than are absorbed from the incident high-energy beam. For example, a landing energy in the range of about 100 eV to about 2000 eV may be used for most materials. The low-energy beam energy is selected so that the beam is attracted to a positively charged sample surface and neutralizes such positive charge. A low-energy beam with a current density that is at least twice that of the high-energy beam seems to work well to maintain voltage equilibrium on the sample surface, and is therefore preferred. Several embodiments for configuring and utilizing a high-energy beam in conjunction with a low-energy beam are described further in the above referenced U.S. provisional application filed on May 15, 2000, which application is incorporated herein in its entirety.

It is important to note that for purposes of the above description the primary electron energy is to be measured at the surface of the sample. The energy of the electrons focused by objective electron lens 15 is generally different than the energy of the electrons at the sample, called the landing energy, and this landing energy is often not easy to predict. The landing energy may depend on factors such as the current density of the beam, the material of the sample and the electric field at the surface.

FIG. 3 is a chart summarizing the differences between, and advantages of, the four PEEM, LEEM, SEM and SEEM techniques. PEEM uses photons instead of primary electrons to produce emitted secondary electrons. PEEM suffers from the problem of positive charge build-up on insulating sample target materials because secondary electrons are being knocked off the sample surface by the photons, but no negatively charged particles replace these secondary electrons. The inspecting photon beam of PEEM can be wide, and parallel imaging can be achieved.

In Low Energy Electron Microscopy (LEEM), a wide beam of primary electrons is projected at the inspection surface, and parallel imaging can be achieved. These primary electrons are relatively low in energy, and the imaging method involves reflecting these low-energy electrons from the surface. Because only low energy electrons are incident, primary electrons are reflected but few secondary electrons are emitted. Also, the low energy implies a negative charge build-up because these electrons are not sufficiently energetic to escape the sample surface.

In Scanning Electron Microscopy (SEM), relatively slow raster scanning imaging must be utilized because the electron beam is focused to a narrow spot size. SEM, however, produces energetic primary source electrons incident at energy $E_2$, which is a stable point on the yield curve, so that charge-neutral operation is attained. Energetic primary electrons produce secondary electrons in SEM.

In the Secondary Electron Emission Microscopy (SEEM) technique of the present invention, a beam of energetic primary electrons is directed at the sample surface with an energy Because a relatively wide beam of primary electrons is introduced, parallel imaging becomes possible, which is significantly faster than SEM imaging. Moreover, these primary electrons can be incident with an energy $E_2$ and/or can be accompanied by electrons of significantly lower energy such that the sample remains charge neutral. SEEM thus combines the most favorable attributes of LEEM and SEM.

Figure 4:
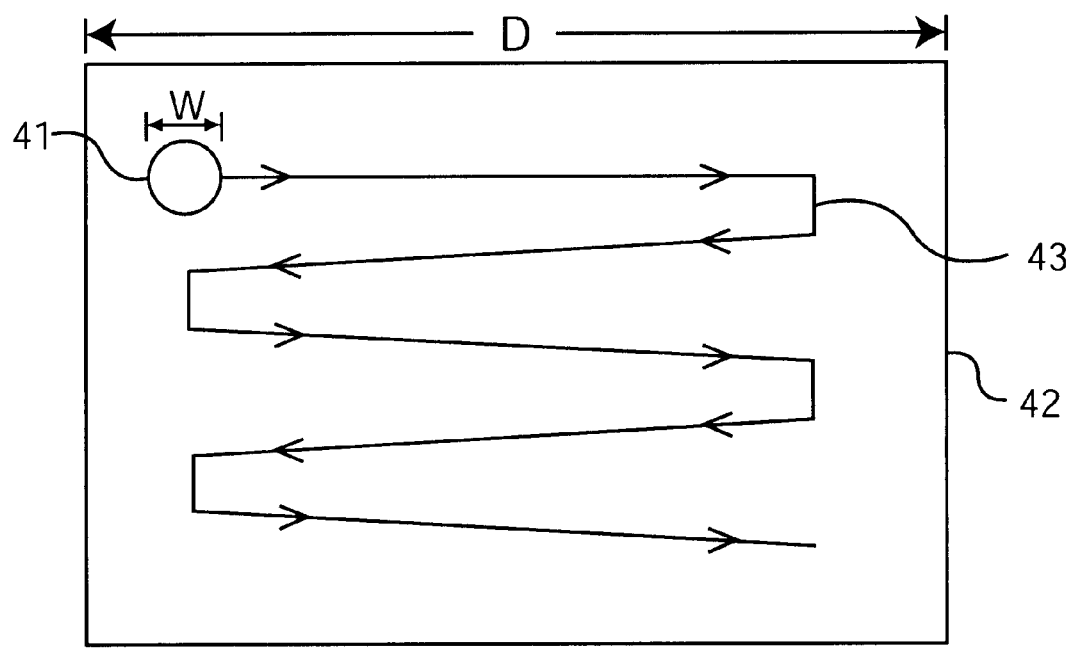
FIG. 4 illustrates an imaging method of SEM.
Figure 5:
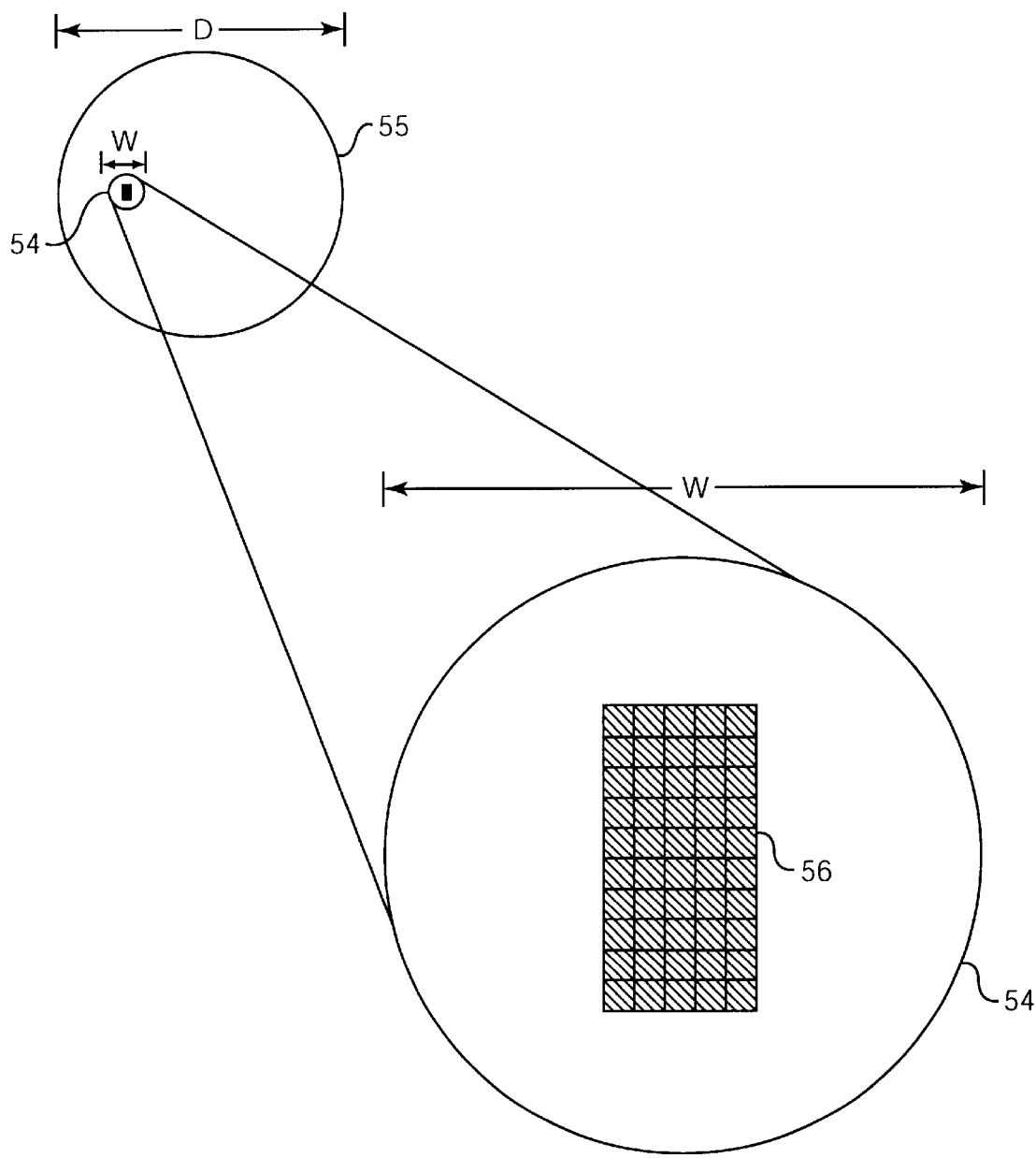
FIG. 5 illustrates an imaging method of SEEM for comparison with FIG. 4.

FIGS. 4 and 5 comparatively illustrate the respective imaging methods of Scanning Electron Microscopy and Secondary Electron Emission Microscopy. In FIG. 4, a Scanning Electron Microscope produces a beam 41 of electrons and directs them at the surface of sample 42 having a characteristic dimension D. Beam 41 has a width "w", which is in the range of 5 to 100 nanometers (50–1000 Angstroms). This beam 41 is raster-scanned in a pattern represented by path 43 across the surface of sample 42. (The number of scan lines is greatly reduced from purposes of illustration.) In order to control the beam 41 so that it travels along raster path 43, it is preferred from the inspection system to include an electron beam steering apparatus for electromagnetically deflecting the electron beam 41. Electrostatic deflection could alternatively or additionally be used.

FIG. 5 shows parallel imaging in the Secondary Electron Emission Microscopy inspection technique of the present invention. Beam 54 is produced from an electron gun source, and beam 54 has a width "W", typically about one to two millimeters, at the surface of sample 55. Sample 55 has the characteristic dimension D, which is much greater than the width W of the electron beam. In SEEM, the width of the electron beam 54 is much larger than in SEM, but it may still be possible and necessary to move the sample 55 with respect to the beam to scan the sample 55. However, in the preferred embodiment, SEEM requires only mechanical movement of the stage of the sample 55 with respect to beam 54, and not an electron beam deflection system for electromagnetically steering beam 41. Electromagnetic and/or electrostatic deflection could still be used, of course, and may be useful for such tasks as compensating for stage vibration or steering the wide beam along a serpentine path. The SEEM inspection system of the present invention can operate much faster than the SEM inspection system because SEEM images thousands or millions of pixels in parallel.

FIG. 5 further shows a magnified view of the imaging portion of the beam 54 on the sample 55 to illustrate the parallel, multi-pixel imaging region 56 within beam 54. A rectangular detector array region 56 occupies a central portion of the beam 54 and defines the imaging aperture. (The detector array is either of the time delay integrating (TDI) or non-integrating type.) The detector array 56 images between about 500 thousand and one million pixels in parallel.

SEEM is therefore 500 thousand to one million times faster than SEM due to the number of pixels in the detector array. If SEEM spends one millisecond looking at a pixel, SEM can only take one or two nanoseconds for that pixel to capture the same data frame at 100 MHz. Accordingly, the current density at the sample surface in SEEM is $10^6$ (i.e. one million) times smaller than in SEM, which results in less damage to the sample. If, say, that 10,000 electrons per pixel are required for a good image, SEM must direct a larger number of electrons per unit time onto the pixel spot. In SEEM, the same number of electrons are spread out over a longer time because one million pixels are imaged simultaneously.

It further follows that SEEM has better noise reduction characteristics than SEM. At 100 MHz, SEM looks at each pixel for one nanosecond, while SEEM looks at each pixel for one millisecond. SEEM, therefore, averages out noise above one Hz, while SEM can only average out noise above 100 MHz. In defect detection applications, this implies fewer false positives and a better signal-to-noise ratio.

Besides the preferred method of using a second lower energy beam in conjunction with a first higher energy beam to control charge build-up, SEEM can obtain additional advantages in charge control by flooding the sample 55 with beam 54, but imaging only the central portion of the beam 54 to eliminate edge effects. Ordinarily, non-uniformities in charge on the imaging surface lead to imaging distortions by deflecting the beam. The sample surfaces at the edge of the beam 54 have less uniform charge distributions than the surfaces at the interior portion of the beam because there is no electron flux outside the circumferences of the beam diameter. There are further edge effects because of the residual charging in areas the beam had already scanned. By flooding an area 54 larger than the imaging area of the detector array region 56, these imaging distortions are avoided. In SEM, edge effects cannot be eliminated by this method because the beam diameter is too small for further aperturing. Additional techniques for reducing the effect of surface charge accumulation are taught in U.S. Pat. No. 5,302,828 to Monahan, which is hereby incorporated by reference.

The present invention optionally may include still other additional means for maintaining the charge balance at the sample. One possibility is to apply a supplemental electric field by attaching electrodes to the sample. A variable voltage control feeds current to the electrodes thereby supplying an additional degree of freedom towards charge balance stability. Another possibility is to introduce a low pressure gas, such as argon, into the vacuum chamber which contains the sample to control the charge balance. The low-pressure gas may act to prevent the accumulation of excess charge on the sample. While the above techniques are exemplary of additional control means for maintaining the charge stability of the sample, they are no mead all-inclusive, and other such techniques may exist or be subsequently discovered to regulate charge control.

Any of these additional charge control means optionally may be utilized with the flooding method of Monahan, supra. The use of an electron beam of a particular energy with respect with the $E_2$ value of the material is one method for maintaining a stable charge balance. The use of additional or alternative charge control means such as using a second low energy beam, flooding, electrodes, and/or low pressure gas provide other methods for maintaining this charge balance. The combination of these first and second order charge control mechanisms may optionally be used for a charge control apparatus.

It is useful to compare the limitations imposed by the maximum scan rate in SEEM and SEM. To summarize the advantages of SEEM over SEM:

Lower Noise. A longer image integration time is obtained for a given sample area. Averaging over longer sampling times results in less noise.

Less Image Distortion. By flooding a larger area on the sample than is imaged, a more uniform charge distribution is maintained from the imaged area, and edge effect distortion is eliminated.

Lower Current Densities. Lower current densities, made possible by parallel imaging and greater dwell times, imply that there is a reduced probability of damage to the sample.

Faster. Parallel imaging means that many pixels (e.g. one million) are imaged at the same time in SEEM. Only one pixel is imaged at one time in SEM.

No High Speed Scanning Electronics. These scanning systems are complex and expensive, but are not required in SEEM because of faster parallel imaging.

Figure 6A:
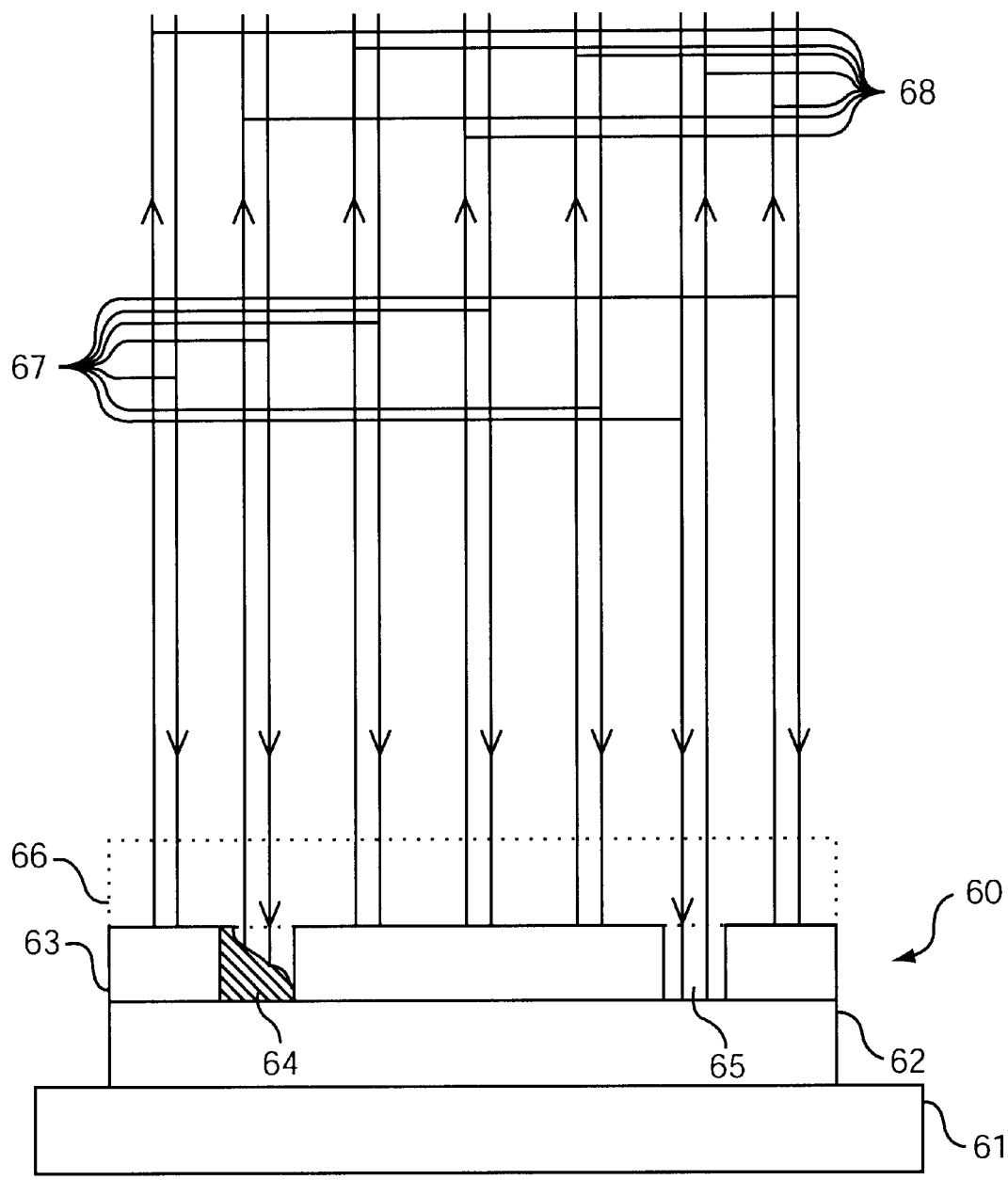
FIG. 6(a) shows how the electron beam of SEEM detects a defect (an obstruction) in a via of an insulating layer.

FIG. 6(a) illustrates how defects in a via between the layers of a semiconductor device are detected in accordance with one embodiment of the present invention. An intermediate stage of fabrication of semiconductor device 60 is shown, In this example, semiconductor device 60 consists of a substrate 61, a metal layer 62 deposited on substrate 61, and an insulating layer 63 formed over metal layer 62. Vias or holes 64, 65 are shown extending through insulating layer 63 to metal layer 62. At a subsequent stage of fabrication, a second metal layer 66 is formed over insulating layer 63, and vias 64, 65 are filled with an electrically conductive material to form electrical connections between metal layers 62 and 66. At the present stage of fabrication, however, metal layer 66 has not yet been deposited, so it is only shown in dotted lines. Generally speaking, vias 64 and 65 are formed by etching insulating layer 63. Via 64, however, is herein shown to be clogged while via 65 is clear. Via 64 may, for example, become clogged with foreign material, or it may be clogged because of imperfections in the etching process. In either event, via 64 represents a defective via, while via 65 represents a perfect via.

FIG. 6(a) further shows a beam 67 of primary electrons incident normal to the surface of semiconductor device 60 onto insulating layer 63. This beam 63 represents the combination of a first beam having higher energy electrons and a second beam having lower energy electrons. Because layer 63 is an insulating material, electron mobility on layer 63 is limited. Insulating layer 63 therefore has a tendency to collect charge on it surface, and this has led to the charge build-up problems associated with prior art inspection techniques such as LEEM. However, in the Secondary Electron Emission Microscopy (SEEM) technique of the present invention, the energy of the higher energy electrons in beam 67 could be chosen to be sufficiently near the $E_2$ value of the material of insulating layer 63, or could be at a different energy, so long as the lower energy beam has an energy appropriate to control charging of layer 63. Thus, upon illumination by primary electron beam 67, a secondary electron beam 68 is produced by insulating material 63 with minimal build-up of charge on surface 63 of the material. The energy of the lower energy electrons in beam 67 is selected to minimize charge build-up on the sample surface resulting from the higher energy electrons.

Returning electron beam 68 may be emitted in a direction normal to the surface of insulating layer 63, and in a sense opposite to primary electron beam 67. Returning electron beam 68 contains information about the defective and perfect vias 64, 65, and this information passes back through the optical system, is detected and subsequently processed to enable the operator to determine whether the semiconductor device 60 is defective.

Figure 6B:
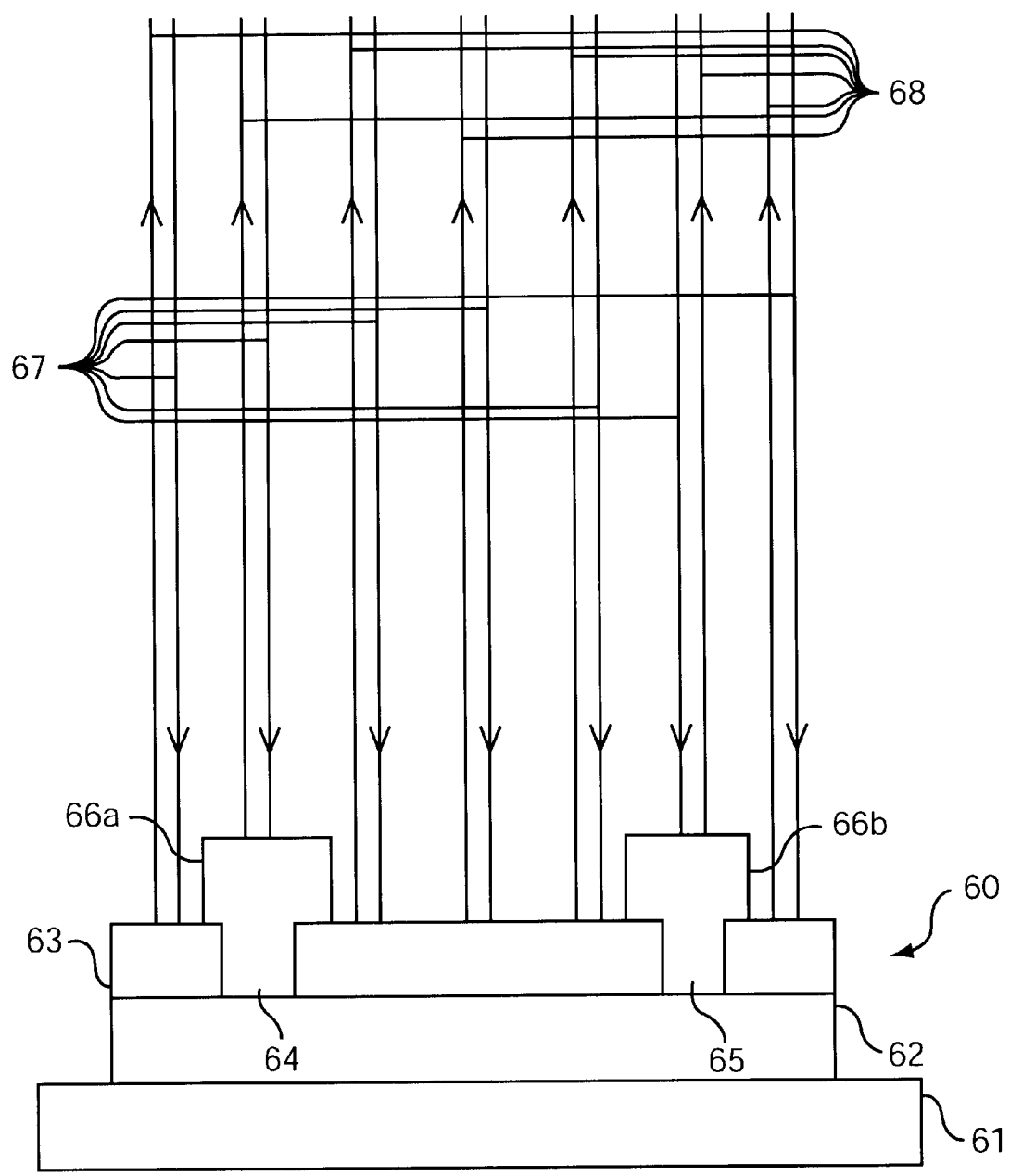
FIG. 6(b) shows how the electron beam of SEEM inspects metal lines connecting vias.

FIG. 6(b) shows electron beam inspection of the semiconductor device 60 of FIG. 6(a) at a subsequent stage of construction. Metal lines 66a and 66b extend in a direction perpendicular to the page to connect metal layer 62 through vias 64, 65, thereby providing electrical contact between lines 66a, 66b and layer 62. Primary electron beam 67 is incident on semiconductor device 60, and particularly on meal lines 66a, 66b and insulating layer 63. Inspective imaging of the surface of metal lines 66a, 66b and insulating layer 63 can be achieved with voltage contrast information derived from returning electron beam 68.

Process control monitoring for the semiconductor industry is thereby improved with electron beam inspection of the present invention as compared with optical beam inspection by reducing or eliminating false positives due to grain structures and color noise. Once a defect has been identified, it may be repaired with a procedure such as focused ion beam implantation if the defect is critical. The information derived from the inspection of substrates can also be used to improve yields of subsequently fabricated semiconductor devices. The SEEM system of the present invention, if desired, could be used in situ as part of a semiconductor wafer manufacturing apparatus, in which wafers could be inspected before, during or after processing, and a common robot could be used for handling the wafers and moving them between inspection and processing stations. The SEEM could also be located in a vacuum chamber that is additionally used for other fabrication purposes, such as ion implantation or deposition. Data from the inspection can be fed forward to subsequent processing stations or fed back to prior processing stations to provide improved automated process control.

Since they contain different kinds of information, it is desirable to separate the images originating from the high and low energy illuminating beams. One novel means of separating the low energy mirror and higher energy scattering images in a dual beam SEEM exploits the principle of synchronous detection. In this mode, the low energy beam and the higher energy beam are not superimposed, but rather are alternately turned on and off (toggled). The image is recorded only while the desired mirror or scattering image is present. During the unwanted part of the toggle cycle, the image beam is also blanked off.

To maintain the desirable charge balance from the low energy beam, the switching rates between the two images can be selected to meet certain conditions. The rate of change in surface potential (charge buildup) $dV/dt$ depends upon the difference $J_a-J_s$ (charge/sec/sq.cm) between the absorbed ($J_a$) and scattered ($J_s$) current densities, and upon the surface layer capacitance C per square cm of surface area, in such a way that $dV/dt=(J_a-J_s)/C$. If $\Delta V$ is the tolerable increase in surface potential (approx. 0.1 Volt) during one cycle, then the beams must be toggled in a time less than $\Delta t < C \Delta V/(J_a-J_s)$. If the toggle time $\Delta t$ for an image element is sufficiently short, the image will behave as though the two beams were actually superimposed, even though the image from only one of the beams is observed. In comparison with the image subtraction method above, this method has the advantage of rejecting noise as well as contrast from the unwanted image.

This mode of operation requires that both the illumination beam and the image beam be turned on and off electron optically (blanked). In one embodiment, the control grid of an electron gun is switched between two voltages to blank the illumination beams. The beam is off when the grid is biased sufficiently negative to prevent electrons from leaving the cathode. The beam is on when the grid is biased more positive. In another embodiment, a beam is deflected (where the deflection is accomplished magnetically, electrostatically or both) at an image plane, so that it passes through an aperture only when the beam should be unblanked. Both of these blanking methods may be applied in a dual beam SEEM to separate its images.

In another embodiment of the invention, both mirror mode and secondary/backscatter mode are used sequentially to create images having different characteristics. In this embodiment, each type of image is sequentially produced, as in the preceding embodiment. However, the image beam is not blanked off, because there is no unwanted part of the toggle cycle. Instead, each type of image is used to determine features of the substrate under observation. As an example, in an "array mode" or a "die to die mode" of semiconductor inspection, a mirror mode image of a first portion of a die is compared to a mirror mode image of a corresponding portion of an array from the same die (for array mode), or a corresponding portion of another die (for die to die mode). A similar die to die comparison or array comparison can then be performed for the secondary/backscatter image. Information derived from both types of comparison can be used to better identify and characterize defects on semiconductor substrates. A more detailed description of die to die mode comparison can be found in commonly assigned U.S. Pat. No. 5,502,306.

More generally, the secondary electron emission microscopy of the present invention is used to inspect defects in any semiconductor device, thin film magnetic head, reticle for semiconductor fabrication or flat panel (e.g., liquid crystal or field effect) display. Insulating, semiconducting, or conducting materials, or even superconductors and plasmas, are capable of being imaged with SEEM. A typical semiconductor fabrication process involves ultraviolet reduction projection of a reticle pattern produced for a wafer design, followed by chemical etching for each of the device layers. Alternatively, semiconductor devices are patterned with ion beams or etching, or by CMP processing. Process inspection and monitoring of the intermediate and final products is then performed with the method of the present invention. The SEEM system of the present invention could also be used for defect review, in which previously inspected wafers are reviewed and the defects located thereon may be characterized Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An apparatus for inspecting a sample comprising:
   a first electron beam generator arranged to direct a first electron beam having a first range of energy levels toward a first area of the sample;
   a second electron beam generator arranged to direct a second electron beam having a second range of energy levels toward a second area of the sample, wherein the second area of the sample at least partly overlaps with the first area and the second range of energy levels are different from the first range such that charge build up caused by the first electron beam is controlled; and
   a detector arranged to detect secondary electrons originating from the sample as a result of the first and second electron beam interacting with the sample.

2. An apparatus as recited in claim 1, wherein the first electron beam has a width appropriate for parallel multi-pixel imaging.

3. An apparatus as recited in claim 2, wherein the first and second electron beam generator are arranged to concurrently produce the first and second beams.

4. An apparatus as recited in claim 2, wherein the first electron beam has a width is sized to produce a spot size on the sample in the range of about 0.1 to 100 millimeters.

5. An apparatus as recited in claim 4, wherein the first electron beam has a width is sized to produce a spot size on the sample in the range of about 1 to 2 millimeters.

6. An apparatus as recited in claim 1, wherein the first range of energy levels are selected to result in a landing energy value of about 1 keV for the first beam and the second range of energy levels are selected to result in a landing energy of about 0 eV for the second beam.

7. An apparatus as recited in claim 1, wherein the first and second electron beam generator are arranged to concurrently produce the first and second beams.

8. An apparatus as recited in claim 1, wherein the second area of the sample that receives the second beam completely encompasses the first area of the sample that receives the first beam.

9. An apparatus as recited in claim 1, wherein the first and second electron beam generators are in the form of:
- a first electron gun source arranged to generate the first electron beam;
- a second electron gun source arranged to generate the second electron beam;
- a magnetic beam separator arranged to direct the first and second electron beams toward the sample; and
- an objective lens arranged to focus the first and second beams onto the sample.

10. An apparatus as recited in claim 1, wherein the detector is in the form of:
- a projection electron lens for focusing the secondary electrons onto an image plane;
- an electron imager arranged within the image plane to receive secondary electrons and convert the secondary electron into photons; and
- an optical detector arranged to receive the photons and generate an image of the sample.

11. An apparatus as recited in claim 10, wherein the optical detector is in the form of a camera or a time delay integration detector.

12. An apparatus as recited in claim 1, wherein the detector is in the form of
- a projection electron lens for focusing the secondary electrons onto an image plane; and
- a back thinned delay integration detector arranged within the image plane to receive and detect the secondary electrons.

13. An apparatus as recited in claim 1, where the second range of energy levels of the second beam are selected to lock in a surface of the sample into a predetermined voltage value such that charge build-up is discharged from the surface of the sample.

14. An apparatus as recited in claim 1, where the second range of energy levels of the second beam are selected such that electrons are deposited on a surface of the sample to reduce positive charge build-up caused by the first electron beam.

15. A method for controlling charging of a surface while exposing the surface to a beam of charged particles, comprising:
- exposing the surface to a first set of electrons in a first beam, the first set of electrons having energies within a first range; and
- exposing the surface to a second set of electrons in a beam, the second set of electrons having energies within a second range, different from the first range, wherein the second range of energies is predetermined to provide electrons from the second set which land on the surface to reduce positive charge present on the surface.

16. The method of claim 15, wherein said surface is alternately exposed to said first set of electrons and said second set of electrons.

17. The method of claim 15, further comprising detecting secondary electrons from the surface resulting from only the first beam or the second beam.

18. The method of claim 15, wherein said second set of electrons is provided in the form of a defocused beam.

19. The method of claim 18, wherein said defocused beam is incident on said substrate over a larger area than an area of said substrate over which said first beam is incident.

20. The method of claim 15, further comprising exposing said surface to an inert gas.

21. The method of claim 20, wherein said inert gas comprises positive ions, and wherein said ions land on said surface and carry away excess negative charge from said surface.

* * * * *